US006933751B2

(12) United States Patent
Wong et al.

(10) Patent No.: US 6,933,751 B2
(45) Date of Patent: Aug. 23, 2005

(54) INTEGRATED SCHOTTKY TRANSISTOR LOGIC CONFIGURATION

(75) Inventors: Thomas S. Wong, San Jose, CA (US); Robert W. Bechdolt, San Jose, CA (US); Phi Thai, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 44 days.

(21) Appl. No.: 10/665,645

(22) Filed: Sep. 18, 2003

(65) Prior Publication Data

US 2005/0062503 A1 Mar. 24, 2005

(51) Int. Cl.[7] ............................................. H03K 19/084
(52) U.S. Cl. ...................... 326/131; 326/116; 326/118; 257/474; 257/477
(58) Field of Search ......................... 326/131, 116–118, 326/104; 257/474, 477, 485, 538, 577; 438/128, 328

(56) References Cited

U.S. PATENT DOCUMENTS

| | | | | |
|---|---|---|---|---|
| 4,898,838 A | * | 2/1990 | Morris et al. ............... | 438/128 |
| 5,140,383 A | * | 8/1992 | Morris et al. ............... | 257/477 |
| 5,244,832 A | * | 9/1993 | Morris et al. ............... | 438/328 |

OTHER PUBLICATIONS

H. H. Berger et al., "Advanced Merged Transistor Logic By Using Schottky Junctions", Microelectronics, vol. 7, pp. 35–42, Mar. 1976, pp. 88–95.

* cited by examiner

Primary Examiner—Vibol Tan
(74) Attorney, Agent, or Firm—Patent Law Group LLP; Brian D. Ogonowsky

(57) ABSTRACT

A logic gate is described that has an N-type region, which may be an N-well or N-tub, forming a cathode of one or more Schottky diodes and a collector of an NPN bipolar transistor. Accordingly, the Schottly diodes and transistor do not need to be isolated from one another, resulting in a very compact logic gate. The logic gate forms a portion of a NAND function in one embodiment. One or more Schottky diodes between the collector and base of the bipolar transistor act as a clamp to prevent the transistor from saturating. The clamp diodes can also be used to adjust the output voltage of the gate to ensure downstream transistors can be fully turned off.

18 Claims, 5 Drawing Sheets

Standard

PNP current source

Second Schottky (Al or Pt)

PMOS current source

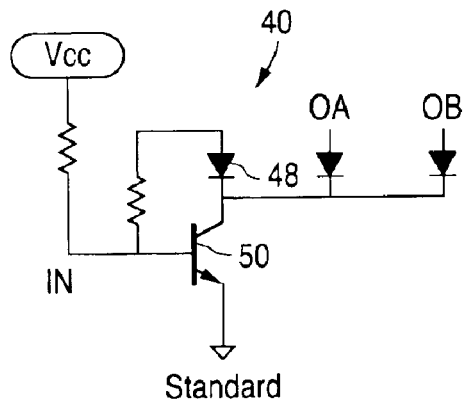
FIG. 9 Standard
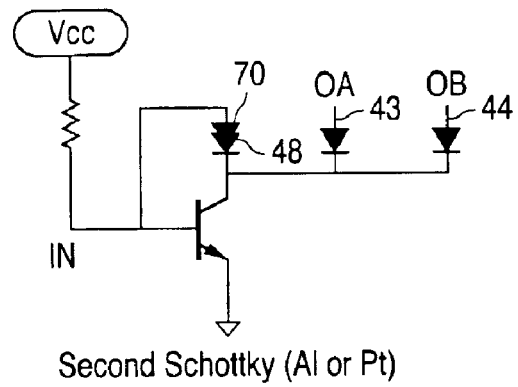
FIG. 10 Second Schottky (Al or Pt)
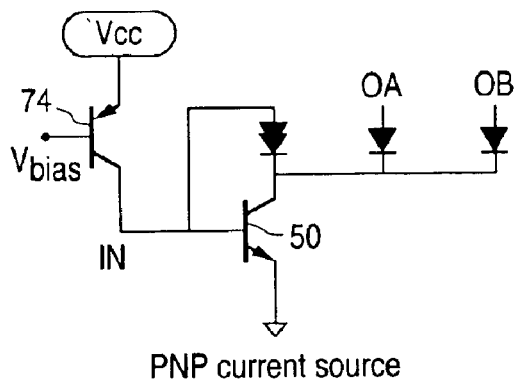
FIG. 11 PNP current source
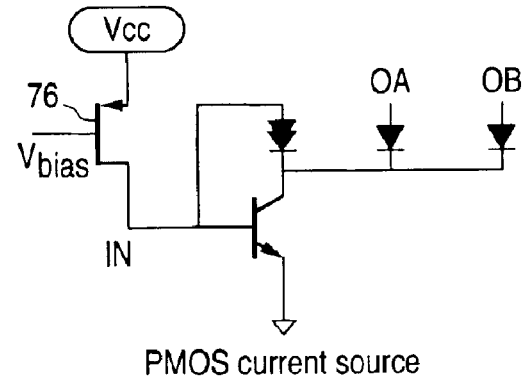
FIG. 12 PMOS current source

INTEGRATED SCHOTTKY TRANSISTOR LOGIC CONFIGURATION

FIELD OF INVENTION

This invention relates to logic circuits and, in particular, to a logic gate incorporating Schottky diodes and bipolar transistors.

BACKGROUND

Any logic function may be performed by combining logic gates. Logic gates include those that perform a logical function such as OR, AND, NOR, NAND, INVERT, and other functions. All logic functions may be implemented with only NAND gates. Logic gates may be implemented in a variety of ways using transistors, both bipolar and MOSFETs, diodes, and resistors.

A prior art NAND gate 10 is shown in FIG. 1, which includes Schottky diodes 12 and 14 connected to inputs A and B respectively. The anodes of the Schottky diodes are connected to the base of a bipolar transistor 16. A voltage source Vcc is coupled to the anodes of the Schottky diodes via resistor R1 and coupled to the collector of transistor 16 via resistor R2 to provide a bias voltage.

The NAND gate of FIG. 1 is commonly used in a programmable logic array or in a logic circuit as a single logic building block unit, with input nodes shown as A and B and an output node shown as output 18. The input and output nodes are connected to respective nodes of identical logic gates or different logic gates. Such a logic unit has certain drawbacks that are avoided by the present invention.

A top down view of a silicon wafer incorporating the Schottky diodes and bipolar transistor in FIG. 1 is shown in FIG. 2. An N+ cathode contact 20 for Schottky diode 12 forms input A of FIG. 1. Cathode 20 makes ohmic contact with an N-well 22. The anode 24 of diode 12 may be formed of a metal layer, typically platinum silicide or aluminum. The metal in contact with the N-well forms the Schottky diode. The diode 12 is isolated from other components by an isolation region 26, which may be an oxide filled trench, a P-well, or other type of isolation structure.

Schottky diode 14 is formed in the identical manner and is isolated from Schottky diode 12.

The NPN bipolar transistor 16 includes a P-well 30 formed in an N-well 32. A P+ base contact 34 and an N+ emitter 36 are formed in the P-well 30. An N+ collector contact region 38 is the output terminal of the NAND gate.

The resistors R1 and R2 and the connections, such as a metallization layer, are not shown for simplicity.

The circuit shown in FIG. 2 requires a relatively large area due to the isolation of the various structures.

FIG. 3 illustrates one type of logic circuit that may be built using the NAND gate logic units of FIG. 1. One of the NAND gate 10 logic units is shown within dashed outline in FIG. 3.

What is needed is a logic gate structure that uses less area than the prior art, thus allowing a higher density of logic gates in a silicon wafer with increased switching speed.

SUMMARY

A logic gate is described that has an N-type region, which may be an N-well or N-tub, forming a cathode of two or more Schottky diodes. A P-well, forming a base of an NPN bipolar transistor, is formed in the N-type region. The N-type region forms a collector of the transistor in common with the cathode of the two or more Schottky diodes. Accordingly, the Schottly diodes and transistor do not need to be isolated from one another, resulting in a very compact logic gate.

In one embodiment, one or more Schottky diodes between the collector and base of the bipolar transistor act as a clamp to prevent the transistor from saturating. The clamp diodes can also be used to adjust the output voltage of the gate to ensure downstream transistors can be fully turned off. A resistor may also be used in series with the one or more Schottky diodes between the collector and the base to adjust the output voltage.

BRIEF DESCRIPTION OF THE DRAWINGS

FIG. 9 is identical to FIG. 4 and is used for comparing the logic gate with variations of the logic gate shown in FIGS. 10–12.

FIGS. 10, 11, and 12 are variations of the logic gate of FIG. 9.

DETAILED DESCRIPTION

Figure 4:
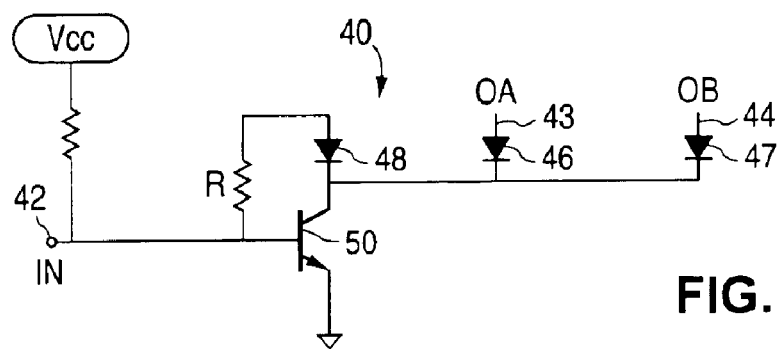
FIG. 4 is an integrated Schottky transistor logic gate in accordance with one embodiment of the invention.

FIG. 4 is a schematic diagram of an Integrated Schottky Transistor Logic™ (ISTL™) gate 40. ISTL is a trademark of Micrel, Inc. Gate 40 has an input node 42 and A and B output nodes 43 and 44, respectively. Gate 40 may have many additional output nodes similar to nodes 43 and 44. As will be explained with respect to FIG. 7, the anode of Schottky diode 46 is coupled to the input of another gate 40, and the anode of Schottky diode 47 is coupled to the input of a different gate 40, where the connections between two gates 40 form a logical function, such as a NAND function.

Schottky diode 48 acts as a clamp to prevent the NPN bipolar transistor 50 from becoming saturated by limiting the base-to-collector voltage. Preventing a transistor becoming saturated reduces the overall power consumption of the circuit and enables faster switching.

Resistor R drops a certain voltage across it when transistor 50 is conducting to lower the output voltage of output nodes 43 and 44 to ensure that that output voltage can fully turn off a bipolar transistor in a downstream gate. Resistor R may be adjusted for the proper voltage drop.

In other examples provided below, resistor R is substituted by another Schottky diode in series with diode 48 to provide the desired voltage drop.

Figure 1:
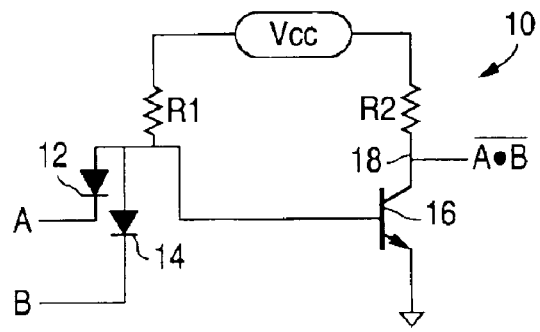
FIG. 1 is a schematic diagram of a prior art NAND gate using Schottky transistor logic.
Figure 6:
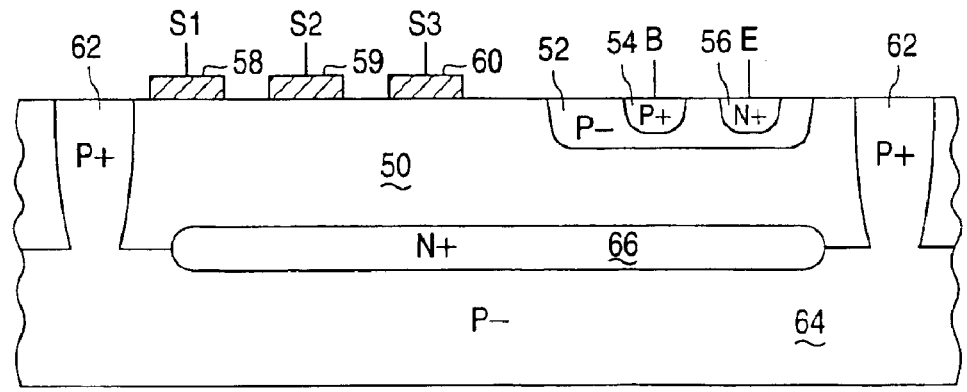
FIG. 6 is a cross-sectional view of the gate shown in FIGS. 4 and 5 in a silicon wafer.
Figure 7:
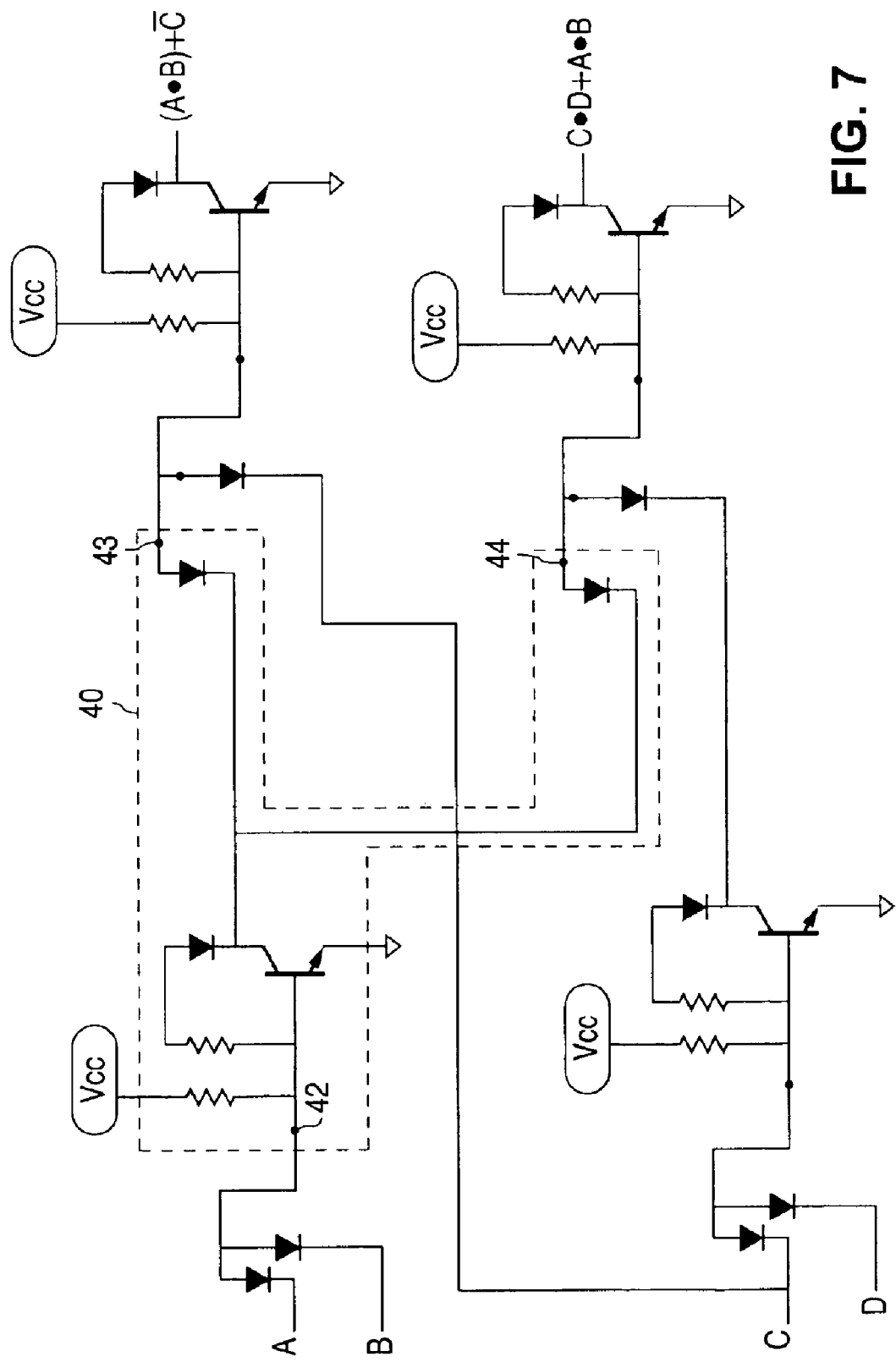
FIG. 7 is a logic circuit using the logic gate of FIG. 4 as a logic building block, where the gate is connected via metallization to inputs and outputs of other similar logic gates.

The configuration of gate 40 as a logic unit for being interconnected with identical or similar logic units enables a resulting logic circuit, such as shown in FIG. 7, to be made much smaller than the same logic circuit built using the logic unit of FIG. 1, as is explained below with respect to FIGS. 5 and 6.

Figure 5:
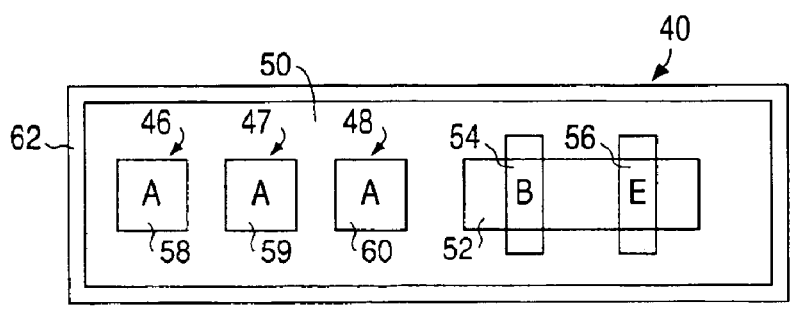
FIG. 5 is a top down view of the logic gate of FIG. 4.

FIG. 5 is a top down view of a silicon wafer portion having formed in it bipolar transistor 50 and Schottky diodes 46–48.

Figure 2:
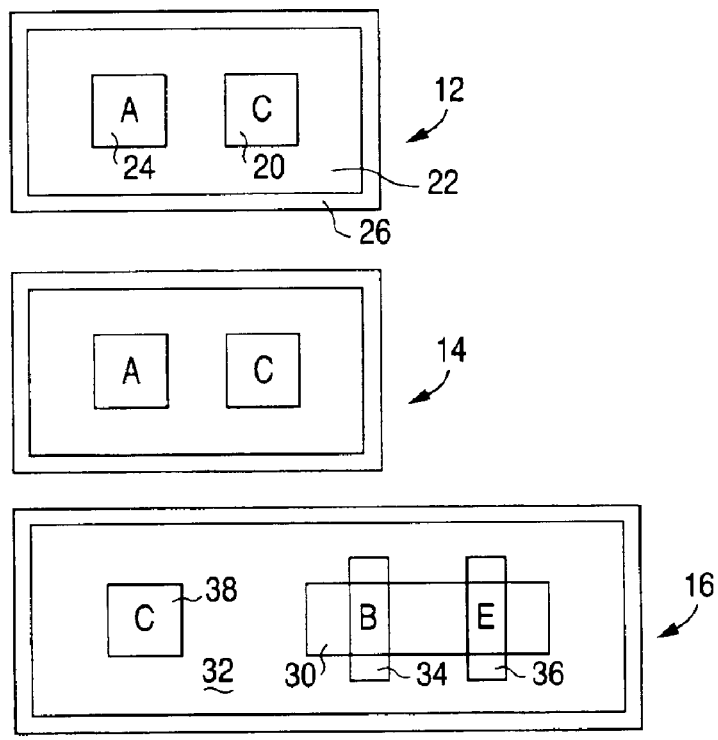
FIG. 2 is a top down view of the NAND gate of FIG. 1 implemented in a silicon wafer.

Resistor R (not shown) may be formed by conventional means, such as a diffused region or a thin film layer, or may be substituted by another Schottky diode. In FIG. 5, an N-well 50 (or N-tub) is common to the bipolar transistor and Schottky diodes of FIG. 4. In contrast, in prior art FIG. 2, the N-wells for the Schottky diodes and bipolar transistor are required to be isolated, resulting in additional silicon surface area for the gate. A P-well base region 52 has formed in it a P+ base contact region 54 and an N+ emitter region 56. The anodes of each of the Schottky diodes 46–48 are shown as metal regions 58–60, respectively. Suitable metals (including silicides of the metals) for the anodes include aluminum, platinum, and titanium. Titanium is preferred for its low barrier height, resulting in a voltage drop across each Schottky diode of approximately 0.3 volts. A typical voltage drop of a Schottky diode using aluminum or platinum silicide as the anode is approximately 0.6 volts.

N-well 50 may be an isolated epitaxial layer tub or may be a diffused region in a P-type epitaxial layer or substrate. Isolation 62 may be provided by the PN interface of a diffused N-well in a P-type material, or may be P+ isolation sinkers (shown in FIG. 6), or may be a trench, or may be any other type of isolation.

FIG. 6 is a cross-sectional view of a silicon wafer with the elements corresponding to those elements in FIG. 5 identified with the same numerals. Additional elements include a P-substrate 64 and an N+ buried layer 66. Other implementations of the circuit of FIG. 4 may also be used.

Figure 3:
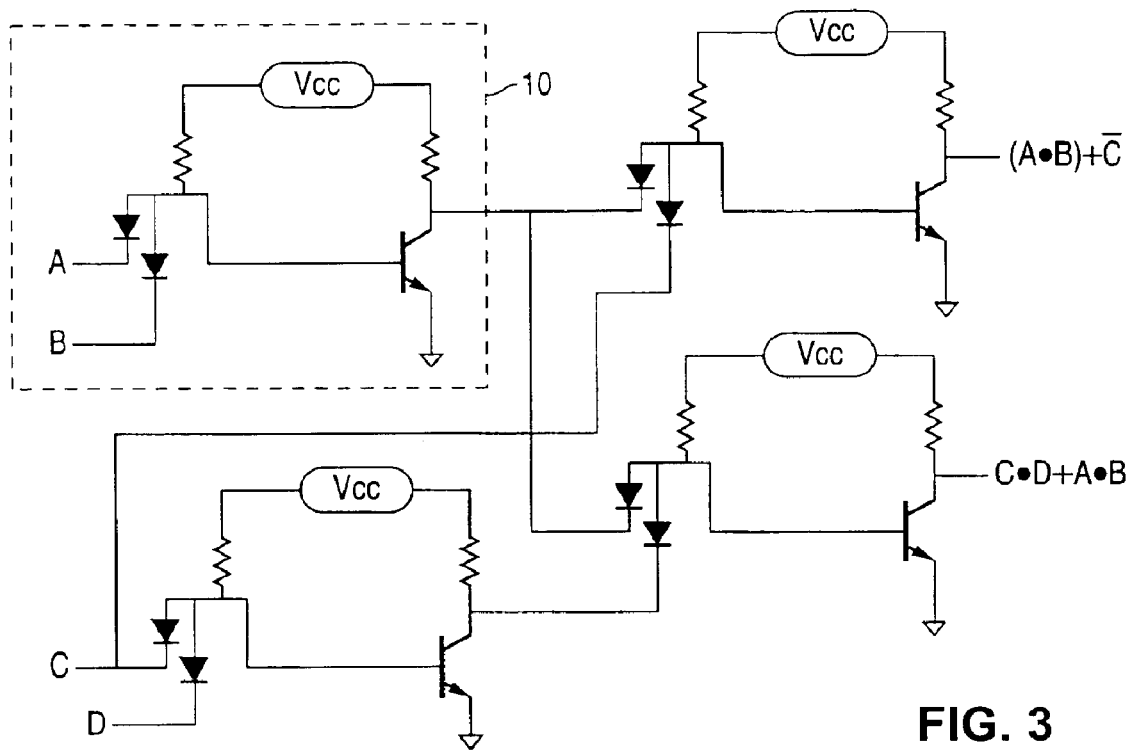
FIG. 3 is a logic circuit using the logic unit of FIG. 1 as a logic building block.

FIG. 7 is identical to the logic diagram of FIG. 3 except it has been built using the logic gate 40 instead of the prior art gate 10. The input and output nodes 42–44 of the gate 40 are identified. The input and output nodes of the gate 40 may be connected to other nodes using standard metallization formed by depositing a metal, such as aluminum, then patterning and etching the aluminum to connect the various nodes to achieve a logical function. Accordingly, the same logic circuit of FIG. 3 is implemented using the ISTL™ gate 40 using much less area. This technique may be used to form other than interconnected NAND gates.

Figure 8:
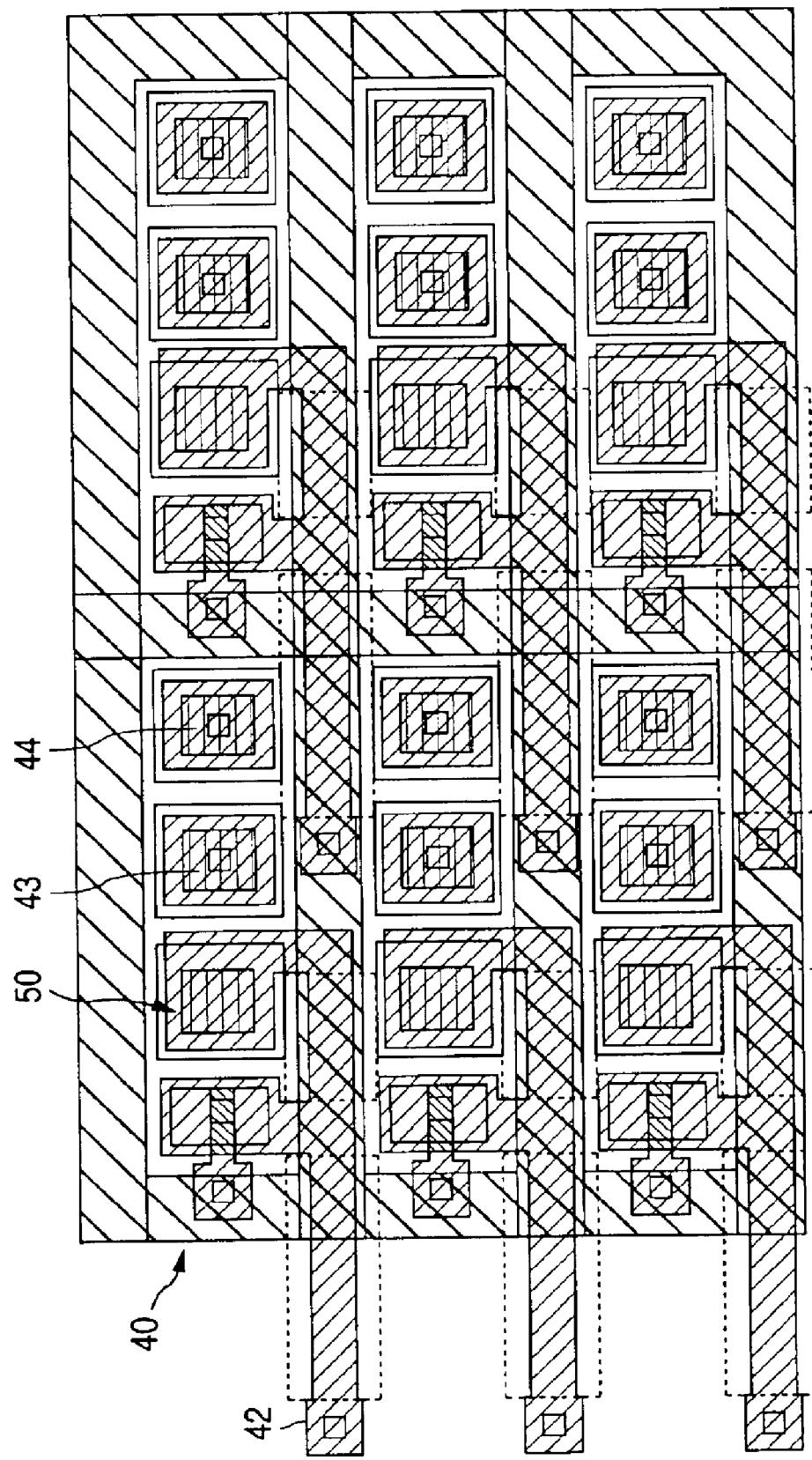
FIG. 8 is a top down view of an array of the logic gates shown in FIG. 4.

FIG. 8 is a composite, top down view of an array of ISTL™ gates 40 prior to nodes of the gates being interconnected by one or more metal layers.

FIG. 9 is identical to FIG. 4. FIG. 10 adds an additional Schottky diode 70 in series with diode 48 to provide a desired voltage drop, instead of resistor R, to ensure the voltage at the output nodes 43 and 44 is sufficient to turn off a downstream bipolar transistor. To achieve the desired voltage drop, the anode metal can be other than titanium, such as aluminum or platinum (e.g., 0.6 volt drop). Any number of Schottky diodes (using Al, Pt, Ti, or any other suitable metal) may be connected in series depending upon the desired voltage drop. In one embodiment, diodes 48 and 70 have Ti anodes, and diodes 43 and 44 have Pt, Al, or Ti anodes, depending on the desired voltage drops.

In FIG. 11, a PNP bipolar transistor 74 supplies the base current for transistor 50. In this configuration, the collector of transistor 74 is made common with the P-well base of transistor 50.

FIG. 12 illustrates a circuit similar to that of FIG. 11 but uses a PMOS current source 76 instead of a PNP bipolar transistor.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is claimed is:

1. A monolithic integrated circuit comprising a plurality of logic gates, a single logic gate comprising:

a P-type well formed in an N-type region, the P-type well forming a base of an NPN bipolar transistor;

an N+ region formed in the P-type well forming an emitter of the bipolar transistor;

the N-type region forming a collector of the transistor in common with the cathodes of two or more Schottky diodes;

nodes of the logic gate being adapted for coupling to nodes of other similar logic gates, the nodes of the logic gate comprising an input node coupled to the base and comprising output nodes coupled to respective anodes of the two or more Schottky diodes, wherein the two or more Schottky diodes comprise one or more output Schottky diodes and at least one clamping Schottky diode, the at least one clamping Schottky diode being coupled between the collector and base of the transistor; and a resistor in series with the at least one clamping Schottky diode, wherein an anode metal of all the Schottky diodes comprises titanium or titanium silicide.

2. A monolithic integrated circuit comprising a plurality of logic gates, a single logic gate comprising:

a P-type well formed in an N-type region, the P-type well forming a base of an NPN bipolar transistor:

an N+ region formed in the P-type well forming an emitter of the bipolar transistor;

the N-type region forming a collector of the transistor in common with the cathodes of two or more Schottky diodes; and nodes of the logic gate being adapted for coupling to nodes of other similar logic gates, the nodes of the logic gate comprising an input node coupled to the base and comprising output nodes coupled to respective anodes of the two or more Schottky diodes, wherein the two or more Schottky diodes comprise one or more output Schottky diodes and at least one clamping Schottky diode, the at least one clamping Schottky diode being coupled between the collector and base of the transistor, wherein there are two or more Schottky diodes connected in series between the collector and base of the transistor.

3. The circuit of claim 2 wherein an anode metal of the at least one clamping Schottky diode comprises titanium or titanium silicide.

4. The circuit of claim 2 wherein an anode metal of at least one of the two or more Schottky diodes connected in series comprises aluminum, titanium, platinum, or silicides of those metals.

5. The circuit of claim 2 wherein the N-type region is a portion of an N-type epitaxial layer, the portion being electrically isolated from other portions of the epitaxial layer.

6. The circuit of claim 2 wherein the N-type region is an N-type well formed within a P-type material.

7. The circuit of claim 2 further comprising an anode metal of each of the two or more Schottky diodes in contact with the N-type region.

8. The circuit of claim 7 wherein the anode metal of at least one Schottky diode comprises aluminum or aluminum silicide.

9. The circuit of claim 7 wherein the anode metal of at least one Schottky diode comprises platinum or platinum silicide.

10. The circuit of claim 7 wherein the anode metal of at least one Schottky diode comprises titanium or titanium silicide.

11. The circuit of claim 2 wherein the logic gate forms a portion of a NAND function.

12. The circuit of claim 2 wherein anodes of the two or more Schottky diodes are coupled to respective bases of additional NPN bipolar transistors.

13. The circuit of claim 2 further comprising multiple logic gates being interconnected such that anodes of the two or more Schottky diodes are coupled to respective bases of bipolar transistors via one or more metal layers.

14. The circuit of claim 2 wherein an anode metal of all the Schottky diodes comprises titanium or titanium silicide.

15. The circuit of claim 1 wherein the N-type region is a portion of an N-type epitaxial layer, the portion being electrically isolated from other portions of the epitaxial layer.

16. The circuit of claim 1 further comprising an anode metal of each of the two or more Schottky diodes in contact with the N-type region.

17. The circuit of claim 1 wherein an anode metal of all the Schottky diodes consists solely of titanium or titanium silicide.

18. The circuit of claim 1 further comprising multiple logic gates being interconnected such that anodes of the two or more Schottky diodes are coupled to respective bases of bipolar transistors via one or more metal layers.

* * * * *